(12) United States Patent
Nakano

(10) Patent No.: US 11,349,382 B2
(45) Date of Patent: May 31, 2022

(54) CONTROLLER

(71) Applicant: TOSHIBA MITSUBISHI-ELECTRIC INDUSTRIAL SYSTEMS CORPORATION, Chuo-ku (JP)

(72) Inventor: Toshihide Nakano, Chuo-ku (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 4 days.

(21) Appl. No.: 17/257,395

(22) PCT Filed: Mar. 6, 2019

(86) PCT No.: PCT/JP2019/008804
§ 371 (c)(1),
(2) Date: Dec. 31, 2020

(87) PCT Pub. No.: WO2020/179004
PCT Pub. Date: Sep. 10, 2020

(65) Prior Publication Data
US 2021/0273549 A1 Sep. 2, 2021

(51) Int. Cl.
*H02M 1/08* (2006.01)
*H02M 7/217* (2006.01)
(Continued)

(52) U.S. Cl.
CPC ............ *H02M 1/08* (2013.01); *H02M 7/217* (2013.01); *H03K 17/567* (2013.01); *H03K 17/722* (2013.01)

(58) Field of Classification Search
CPC ........ H02M 1/08; H02M 1/088; H02M 7/217; H03K 17/567; H03K 17/722
See application file for complete search history.

(56) References Cited

U.S. PATENT DOCUMENTS

| 11,245,337 | B2 * | 2/2022 | Zhang | ............... H02M 3/33507 |
| 2021/0242770 | A1 * | 8/2021 | Zhang | .................. H03K 17/107 |
| 2022/0014109 | A1 * | 1/2022 | Ye | ..................... H02M 3/33592 |

FOREIGN PATENT DOCUMENTS

| EP | 3 139 480 A2 | 3/2017 |
| JP | 59-37733 A | 3/1984 |

(Continued)

OTHER PUBLICATIONS

Indian Office Action dated Dec. 29, 2021 in Indian Patent Application No. 202017055886, 5 pages.

(Continued)

*Primary Examiner* — Adolf D Berhane
(74) *Attorney, Agent, or Firm* — Oblon, McClelland, Maier & Neustadt, L.L.P.

(57) ABSTRACT

A controller (3) includes an AC voltage generator (12) that generates first to Nth AC voltages, a DC voltage generator (13) that converts the first to Nth AC voltages into first to Nth DC voltages, respectively, and a driver (14) that turns on and off a switch (1) based on the first to Nth DC voltages. The AC voltage generator (12) includes first to Nth isolation transformers (T1 to TN). The primary windings of the nth and (n+1)th isolation transformers receive an AC source voltage. The nth to first isolation transformers are sequentially connected. The (n+1)th to Nth isolation transformers are sequentially connected. The first to Nth isolation transformers respectively output the first to Nth AC voltages from their respective secondary windings.

9 Claims, 10 Drawing Sheets

(51) Int. Cl.
 *H03K 17/567* (2006.01)
 *H03K 17/722* (2006.01)

(56) References Cited

FOREIGN PATENT DOCUMENTS

JP            9-162710 A    6/1997
JP         2013-226050 A   10/2013

OTHER PUBLICATIONS

International Search Report dated May 28, 2019 in PCT/JP2019/008804 filed on Mar. 26, 2019, 2 pages.

* cited by examiner

CONTROLLER

TECHNICAL FIELD

The present invention relates to a controller, and particularly to a controller that controls a switch including a plurality of semiconductor switching elements connected in series.

BACKGROUND ART

For example, Japanese Patent Laying-Open No. 59-37733 (PTL 1) discloses a controller that controls a switch including first to Nth semiconductor switching elements connected in series. This controller includes an AC voltage generator, a DC voltage generator, and a driver. The AC voltage generator generates first to Nth AC voltages. The DC voltage generator converts the first to Nth AC voltages into first to Nth DC voltages, respectively. The driver provides the first to Nth DC voltages to the gates of the first to Nth semiconductor switching elements, respectively, to bring the switch into conduction.

The AC voltage generator includes first to Nth isolation transformers. The primary winding of the first isolation transformer receives an AC source voltage. The secondary windings of the first to (N−1)th isolation transformers are connected to the primary windings of the second to Nth isolation transformers, respectively. The first to Nth isolation transformers respectively output first to Nth AC voltages from their respective secondary windings.

CITATION LIST

Patent Literature

PTL 1: Japanese Patent Laying-Open No. 59-37733

SUMMARY OF INVENTION

Technical Problem

In the controller of PTL 1, in which the first to Nth isolation transformers are sequentially connected, each isolation transformer requires a load capacity equal to the sum of the load capacities of all the isolation transformers downstream from itself. For example, if N=7, with the seventh isolation transformer having a load capacity of P, then the load capacities of the first to seventh isolation transformers are 7P, 6P, 5P, . . . , 2P, P, respectively (see FIG. 6). The sum of the load capacities of the first to Nth isolation transformers is thus large, resulting in an increased size and cost of the apparatus.

In view of the above, a main object of the present invention is to provide a small-size, inexpensive controller.

Solution to Problem

A controller according to the present invention controls a switch including first to Nth semiconductor switching elements connected in series. The controller includes an AC voltage generator that generates first to Nth AC voltages; a DC voltage generator that converts the first to Nth AC voltages into first to Nth DC voltages, respectively; and a driver that provides the first to Nth DC voltages to the gates of the first to Nth semiconductor switching elements, respectively, to turn on the switch, and stops supplying the first to Nth DC voltages to the gates of the first to Nth semiconductor switching elements, respectively, to turn off the switch.

The AC voltage generator includes first to Nth isolation transformers. The primary windings of the nth and (n+1)th isolation transformers receive an AC source voltage. The primary windings of the first to (n−1)th isolation transformers are connected to the secondary windings of the second to nth isolation transformers, respectively. The primary windings of the (n+2)th to Nth isolation transformers are connected to the secondary windings of the (n+1)th to (N−1)th isolation transformers, respectively. The first to Nth isolation transformers respectively output the first to Nth AC voltages from their respective secondary windings. N is a natural number of two or more, and n is a natural number smaller than N.

Advantageous Effects of Invention

In a controller according to the present invention, the nth to first isolation transformers are sequentially connected, and the (n+1)th to Nth isolation transformers are sequentially connected. For example, if N=7 and n=4, with the Nth isolation transformer having a load capacity of P, then the load capacities of the first to seventh isolation transformers are P, 2P, 3P, 4P, 3P, 2P, P, respectively. The sum of the load capacities of the first to Nth isolation transformers can thus be smaller than that of a conventional apparatus, allowing a reduced size and cost of the apparatus.

DESCRIPTION OF EMBODIMENTS

Embodiment 1

Figure 1:
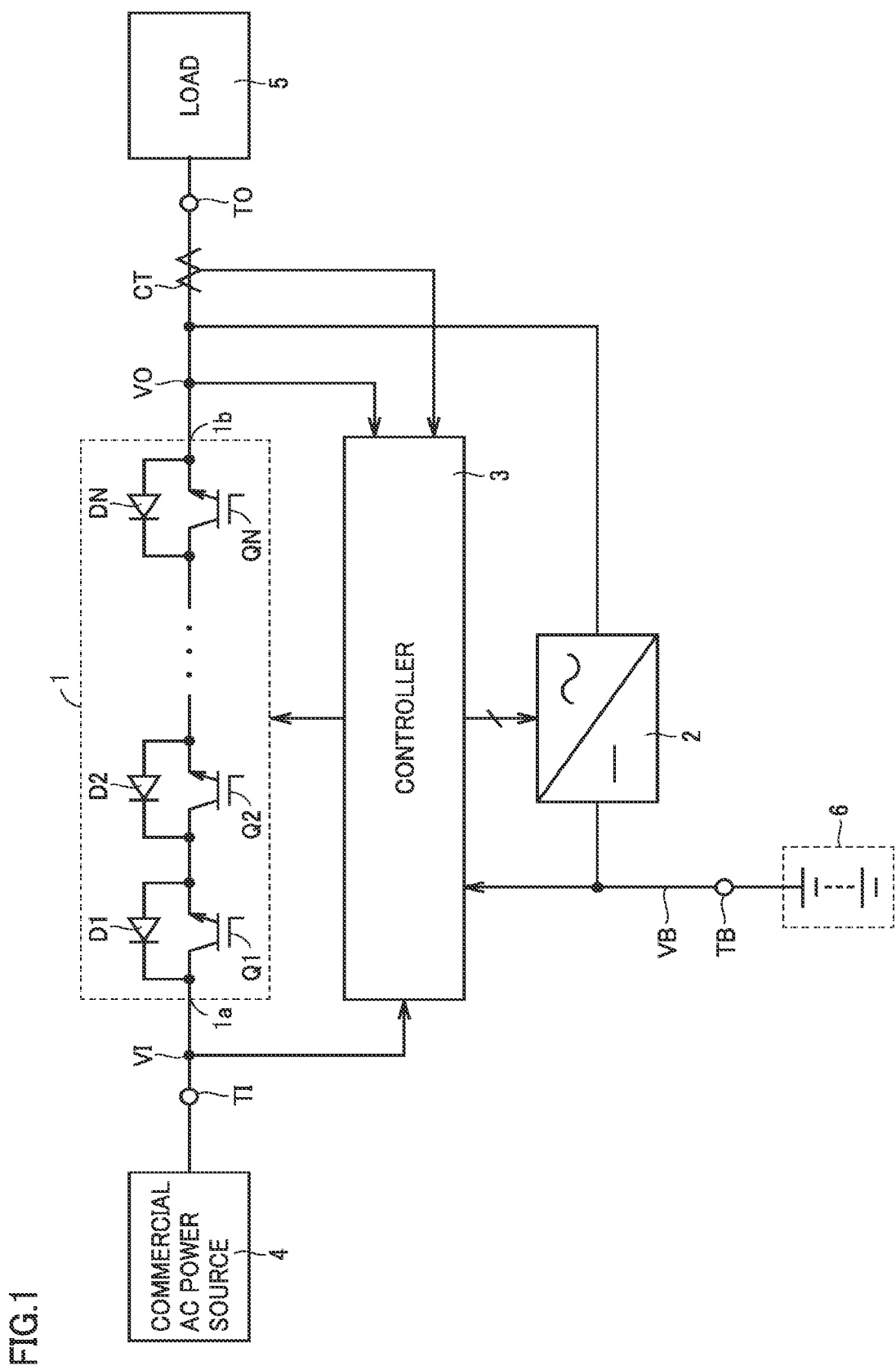
FIG. 1 is a circuit block diagram showing a configuration of an uninterruptible power supply according to embodiment 1 of the present invention.

FIG. 1 is a circuit block diagram showing a configuration of an uninterruptible power supply according to embodiment 1 of the present invention. Although this uninterruptible power supply supplies three-phase AC power to a load, FIG. 1 shows only a portion associated with a single phase for simplicity of the drawing and the description. Such an uninterruptible power supply is also called a multiple power compensator.

In FIG. 1, this uninterruptible power supply includes an AC input terminal TI, an AC output terminal TO, a battery terminal TB, a switch 1, a current detector CT, a bidirectional converter 2, and a controller 3.

AC input terminal TI receives an AC voltage VI having a commercial frequency from a commercial AC power source 4. The instantaneous value of AC input voltage VI is detected by controller 3. Controller 3 determines whether or not AC voltage VI is being normally supplied from commercial AC power source 4, based on the instantaneous value of AC input voltage VI.

AC output terminal TO is connected to a load 5. Load 5 is driven by AC power supplied from the uninterruptible power supply. The instantaneous value of an AC output voltage VO appearing at AC output terminal TO is detected by controller 3.

Battery terminal TB is connected to a battery 6. Battery 6 stores DC power. A capacitor may be connected instead of battery 6. The instantaneous value of a voltage VB between the terminals of battery 6 is detected by controller 3.

Switch 1 has one terminal 1a connected to AC input terminal TI, and the other terminal 1b connected to AC output terminal TO. Switch 1 includes N insulated gate bipolar transistors (IGBTs) Q1 to QN connected in series between one terminal 1a and the other terminal 1b, and N diodes D1 to DN. N is a natural number of two or more, e.g., seven. Diodes D1 to DN are respectively connected in antiparallel to IGBTs Q1 to QN.

Switch 1 is controlled by controller 3. When AC voltage VI is being normally supplied from commercial AC power source 4 (at the time of normal supply from commercial AC power source 4), switch 1 is ON. When AC voltage VI is not being normally supplied from commercial AC power source 4 (at the time of a power failure of commercial AC power source 4), switch 1 is OFF.

Current detector CT detects the instantaneous value of an AC current (load current) IO flowing from the other terminal 1b of switch 1 to AC output terminal TO, and provides a signal indicating the detection value to controller 3.

Bidirectional converter 2, which is connected between the other terminal 1b of switch 1 and battery terminal TB, is controlled by controller 3. At the time of normal supply from commercial AC power source 4, bidirectional converter 2 converts AC power, which is supplied from commercial AC power source 4 through switch 1, into DC power, and supplies the DC power to battery 6 for storage. At this time, controller 3 controls bidirectional converter 2 so that voltage VB between the terminals of battery 6 is a reference voltage VBr.

At the time of a power failure of commercial AC power source 4, bidirectional converter 2 converts DC power from battery 6 into AC power having a commercial frequency, and supplies the AC power to load 5. At this time, controller 3 controls bidirectional converter 2, based on AC output voltage VO and AC output current IO, so that AC output voltage VO is a reference voltage VOr. When voltage VB between the terminals of battery 6 drops to a lower limit voltage, controller 3 causes bidirectional converter 2 to stop operation.

The operation of this uninterruptible power supply will now be described. At the time of normal supply from commercial AC power source 4, switch 1 is ON, during which AC power from commercial AC power source 4 is supplied through switch 1 to load 5, thus causing load 5 to operate. AC power from commercial AC power source 4 is also supplied through switch 1 to bidirectional converter 2, where the AC power is converted into DC power to be supplied to battery 6 for storage.

Occurrence of a power failure in commercial AC power source 4 immediately turns off switch 1, thus electrically disconnecting load 5 from commercial AC power source 4. At the same time, DC power from battery 6 is converted by bidirectional converter 2 into AC power to be supplied to load 5. Load 5 can thus uninterruptedly operate as long as DC power is stored in battery 6, even under a power failure.

Figure 2:
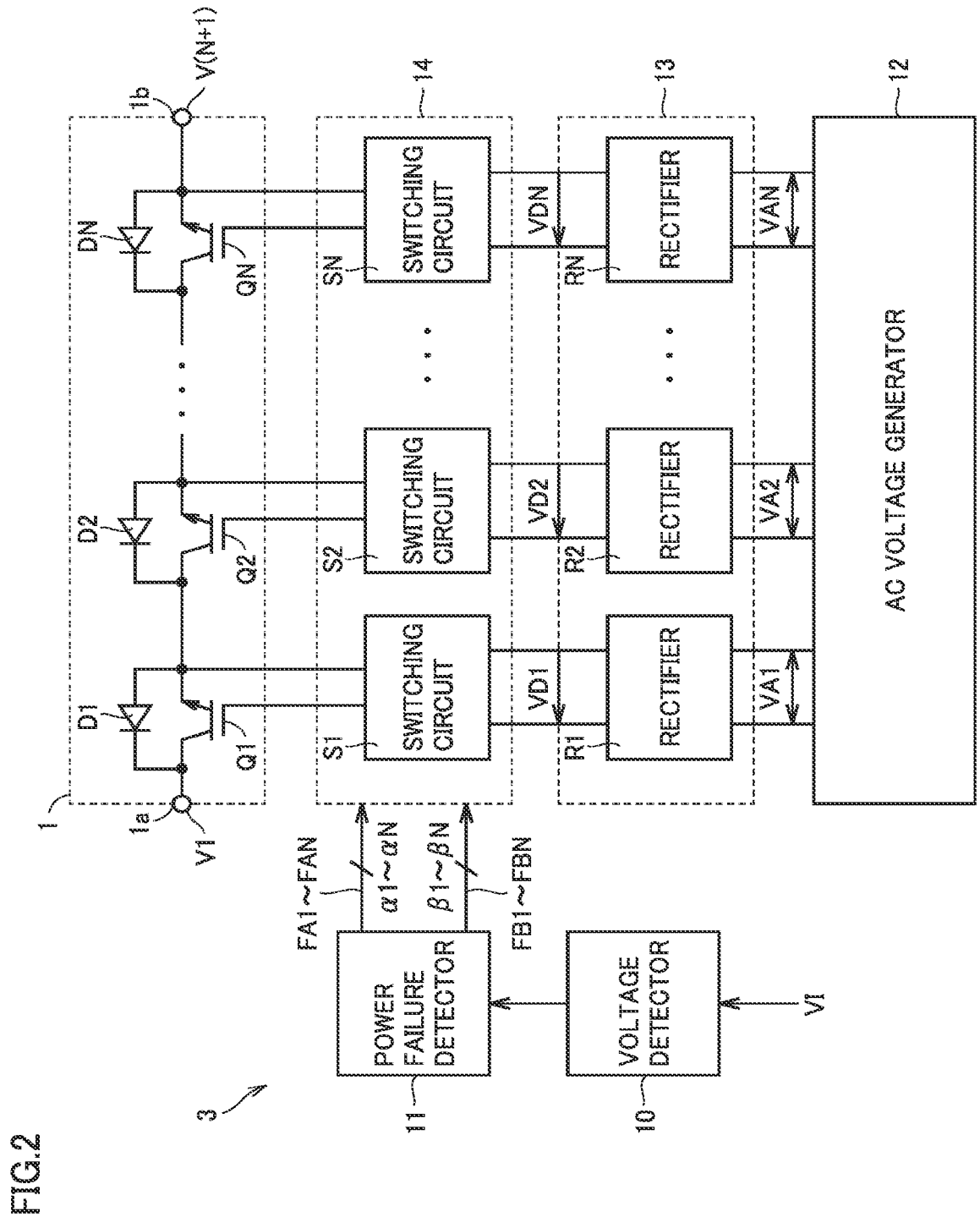
FIG. 2 is a circuit block diagram showing a configuration of a portion of the controller shown in FIG. 1 associated with the control of a switch.

FIG. 2 is a circuit block diagram showing a configuration of a portion of controller 3 shown in FIG. 1 associated with the control of switch 1. In FIG. 2, controller 3 includes a voltage detector 10, a power failure detector 11, optical fibers FA1 to FAN and FB1 to FBN, an AC voltage generator 12, a DC voltage generator 13, and a driver 14.

Voltage detector 10 detects the instantaneous value of AC voltage VI supplied from commercial AC power source 4 (FIG. 1), and outputs a signal indicating the detection value. Power failure detector 11 (determination unit) determines, based on the output signal from voltage detector 10, whether or not commercial AC power source 4 is normal, and outputs optical signals $\alpha 1$ to $\alpha N$ and $\beta 1$ to $\beta N$ indicating the determination result. AC voltage VI is, for example, 6.6 kV.

When AC input voltage VI is higher than the lower limit voltage, commercial AC power source 4 is determined to be normal. In this case, optical signals $\alpha 1$ to $\alpha N$ are output, whereas output of optical signals $\beta 1$ to $\beta N$ is stopped. When AC input voltage VI is lower than the lower limit voltage, commercial AC power source 4 is determined to be not normal. In this case, output of optical signals $\alpha 1$ to $\alpha N$ is stopped, whereas optical signals $\beta 1$ to $\beta N$ are output.

Optical signals $\alpha 1$ to $\alpha N$ are provided to driver 14 through optical fibers FA1 to FAN, respectively. Optical signals $\beta 1$ to $\beta N$ are provided to driver 14 through optical fibers FB1 to FBN, respectively.

AC voltage generator 12 outputs N AC voltages VA1 to VAN. AC voltages VA1 to VAN are the same in magnitude (e.g., effective value), which is 200 V for example. DC voltage generator 13 converts AC voltages VA1 to VAN into DC voltages VD1 to VDN, respectively. DC voltages VD1 to VDN are the same in magnitude.

DC voltage generator 13 includes N rectifiers R1 to RN. Rectifiers R1 to RN receive AC voltages VA1 to VAN and output DC voltages VD1 to VDN, respectively. Rectifier R1 rectifies AC voltage VA1 to generate DC voltage VD1. The other rectifiers R2 to RN operate in the same way as rectifier R1.

Driver 14 includes N switching circuits S1 to SN. Switching circuits S1 to SN respectively receive DC voltages VD1 to VDN, and are connected between the gates and the emitters of IGBTs Q1 to QN, respectively. Switching circuits S1 to SN are connected to power failure detector 11 via optical fibers FA1 to FAN, respectively, and are connected to power failure detector 11 via optical fibers FB1 to FBN, respectively.

In response to optical signal $\alpha 1$ from optical fiber FA1, switching circuit S1 provides DC voltage VD1 between the gate and the emitter of IGBT Q1, turning on IGBT Q1. In response to optical signal $\beta 1$ from optical fiber FB1, switching circuit S1 connects the gate and the emitter of IGBT Q1, turning off IGBT Q1. The other switching circuits S2 to SN operate in the same way as switching circuit S1.

Thus, optical signals α1 to αN from power failure detector 11 turn on switch 1 (IGBTs Q1 to QN), whereas optical signals β1 to βN from power failure detector 11 turn off switch 1 (IGBTs Q1 to QN).

Figure 3:
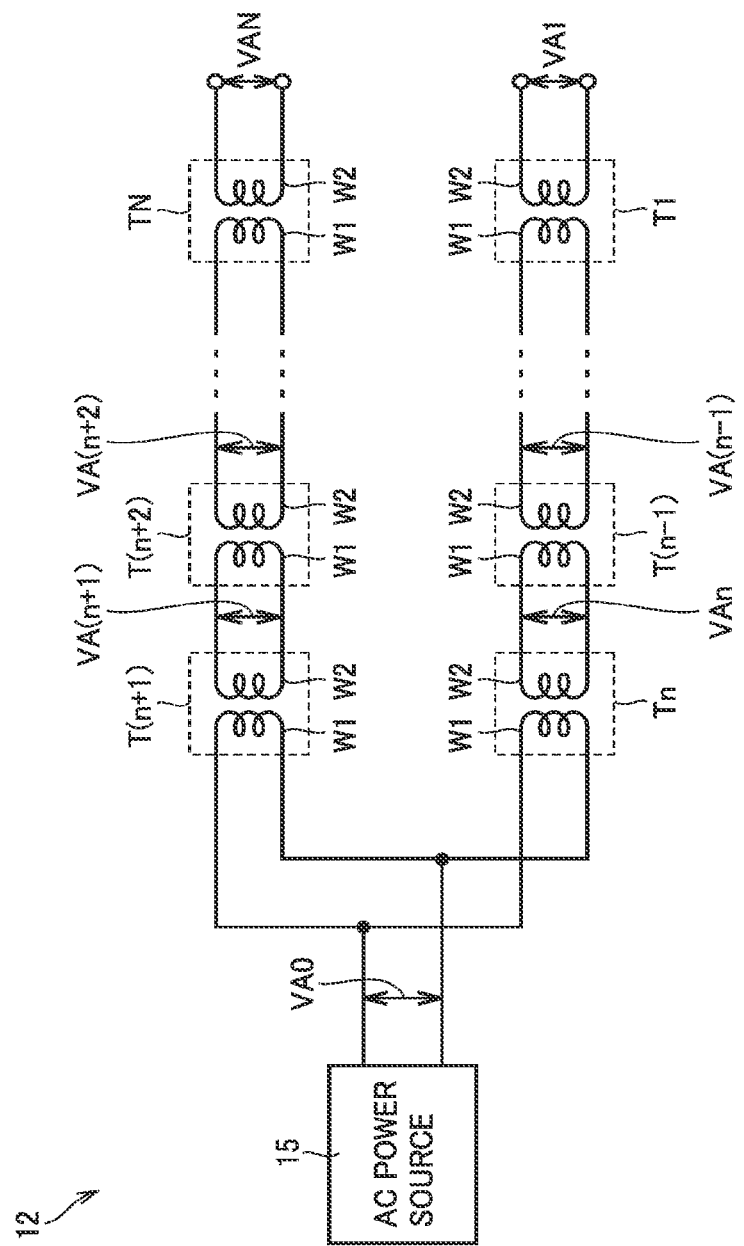
FIG. 3 is a circuit block diagram showing a configuration of the AC voltage generator shown in FIG. 2.

FIG. 3 is a circuit block diagram showing a configuration of AC voltage generator 12 shown in FIG. 2. In FIG. 3, AC voltage generator 12 includes an AC power source 15 and N isolation transformers T1 to TN. AC power source 15 generates an AC source voltage V0 having a predetermined frequency f0. Frequency 10 is set to a frequency that can be transmitted by a relatively small isolation transformer (e.g., 10 kHz).

Figure 4:
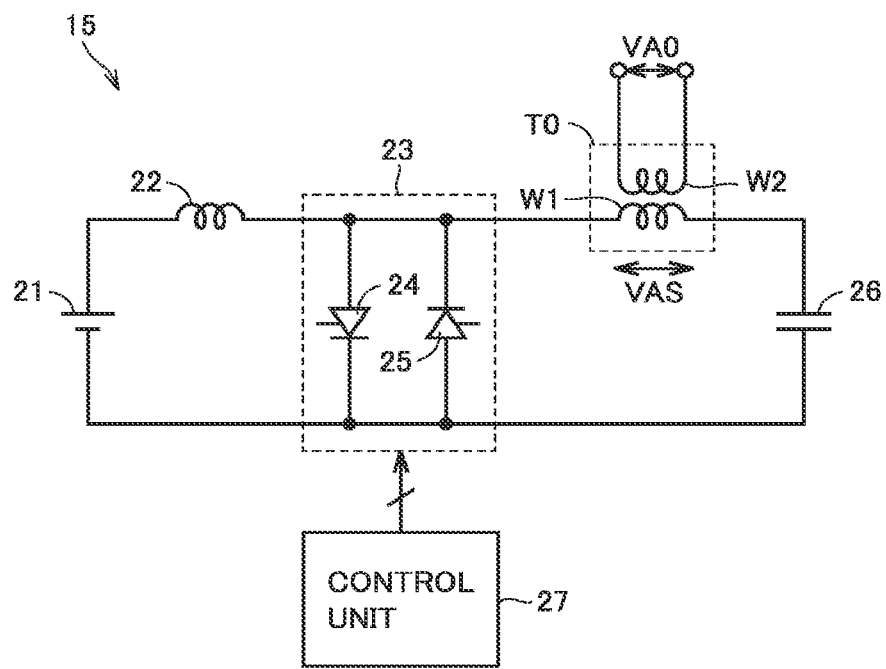
FIG. 4 is a circuit block diagram showing a configuration of the AC power source shown in FIG. 3.

As shown in FIG. 4, AC power source 15 includes a DC power source 21, a reactor 22, a switch 23, an isolation transformer T0, a capacitor 26, and a control unit 27. Switch 23 includes a pair of thyristors 24 and 25.

Reactor 22 has one terminal connected to the positive electrode of DC power source 21; and the other terminal connected to the negative electrode of DC power source 21, with primary winding W1 of isolation transformer T0 and capacitor 26 being connected therebetween. Thyristor 24 has an anode connected to the other terminal of reactor 22, and a cathode connected to the negative electrode of DC power source 21. Thyristor 25 is connected in antiparallel to thyristor 24.

Primary winding W1 of isolation transformer T0 and capacitor 26 form an LC resonant circuit having a predetermined resonant frequency. Control unit 27 alternately turns on thyristors 24 and 25 at the resonant frequency. This causes an AC voltage VAS to be generated at primary winding W1 of isolation transformer T0. An AC source voltage VA0 is then output from its secondary winding W2.

Returning to FIG. 3, primary windings W1 of isolation transformers Tn and T(n+1) receive AC source voltage V0, where n is a natural number smaller than N. For example, N=7 and n=3 are satisfied. Primary windings W1 of isolation transformers T1 to T(n−1) are connected to secondary windings W2 of isolation transformers T2 to Tn, respectively.

Primary windings W1 of isolation transformers T(n+2) to TN are connected to secondary windings W2 of isolation transformers T(n+1) to T (N−1), respectively. Isolation transformers T1 to TN respectively output AC voltages VA1 to VAN from their respective secondary windings W2.

In this AC voltage generator 12, isolation transformers Tn to T1 are sequentially connected, and isolation transformers T(n+1) to TN are sequentially connected. For example, if N=7 and n=3, with isolation transformer T7 having a load capacity of P, then the load capacities of isolation transformers T1 to T7 are P, 2P, 3P, 4P, 3P, 2P, P, respectively, with the sum of the load capacities being 16P. Even if isolation transformers each having a load capacity of 4P are used as isolation transformers T1 to T7 for better manufacturing efficiency, the sum of the load capacities is 28P.

In each of isolation transformers T0 to TN, the ratio between the number of turns of secondary winding W2 and the number of turns of primary winding W1 is 1, with isolation transformers T0 to TN each having a transformation ratio of 1. This means that AC voltage VAS, AC source voltage VA0, and AC voltages VA1 to VAN are the same in magnitude. In isolation transformer T0, however, the ratio between the number of turns of secondary winding W2 and the number of turns of primary winding W1 is not necessarily limited to 1. Isolation transformer T0 may step down AC voltage VAS to output AC source voltage VA0.

Figure 5:
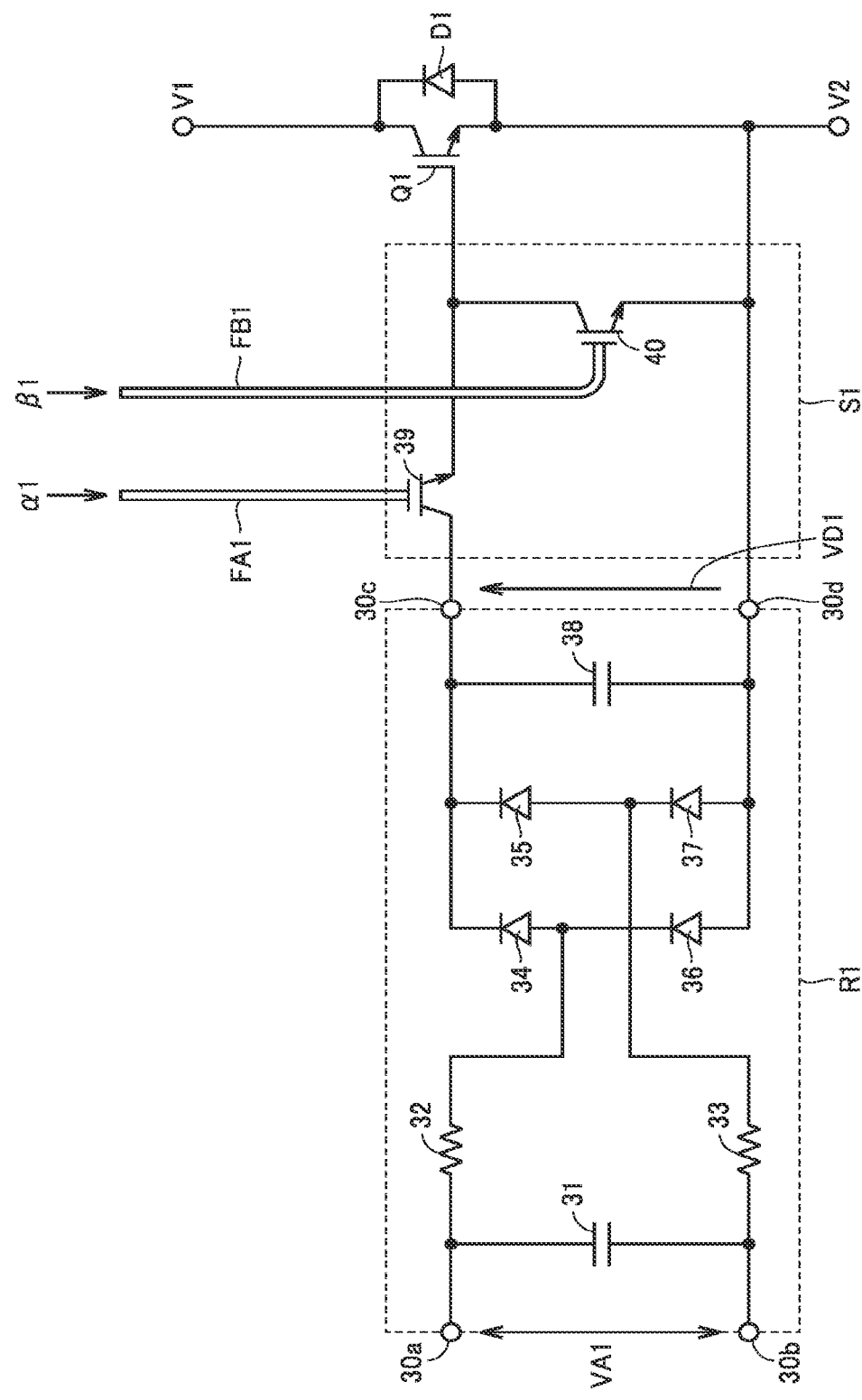
FIG. 5 is a circuit diagram showing a configuration of a rectifier and switching circuit shown in FIG. 2.

FIG. 5 is a circuit diagram showing a configuration of rectifier R1 and switching circuit S1 shown in FIG. 2. In FIG. 5, rectifier R1 includes input terminals 30a and 30b, output terminals 30c and 30d, capacitors 31 and 38, resistance elements 32 and 33, and diodes 34 to 37; and switching circuit S1 includes optical transistors 39 and 40.

Input terminals 30a and 30b of rectifier R1 receive AC voltage VA1 from secondary winding W2 of corresponding isolation transformer T1. Capacitor 31, called a matching capacitor, is connected between input terminals 30a and 30b. Capacitor 31 has a capacitance value such that AC output voltages VA1 to VAN of isolation transformers T1 to TN are the same in magnitude.

Resistance elements 32 and 33 each have one terminal connected to a corresponding one of input terminals 30a and 30b, and the other terminal connected to the anode of a corresponding one of diodes 34 and 35. Resistance elements 32 and 33 adjust the input current of rectifier R1.

Diodes 34 and 35 have their respective cathodes both connected to output terminal 30c. Diodes 36 and 37 have their respective anodes both connected to output terminal 30d, and have their respective cathodes connected to the anodes of diodes 34 and 35, respectively. Diodes 34 to 37 form a full-wave rectifier circuit to convert AC voltage VA1 into DC voltage VD1. Capacitor 38 smooths and stabilizes DC voltage VD1.

Optical transistor 39 has a collector connected to output terminal 30c of rectifier R1, an emitter connected to the gate of IGBT Q1, and a base connected to the output end of optical fiber FA1. When optical signal al is being output from power failure detector 11 (FIG. 2) (at the time of normal supply from commercial AC power source 4), optical transistor 39 is ON; whereas when output of optical signal al is stopped (at the time of a power failure of commercial AC power source 4), optical transistor 39 is OFF.

Optical transistor 40 has a collector connected to the gate of IGBT Q1, an emitter connected to the emitter of IGBT Q1, and a base connected to the output end of optical fiber FB1. When optical signal β1 is being output from power failure detector 11 (FIG. 2) (at the time of a power failure of commercial AC power source 4), optical transistor 40 is ON; whereas when output of optical signal 131 is stopped (at the time of normal supply from commercial AC power source 4), optical transistor 40 is OFF. The other rectifiers R2 to RN and the other switching circuits S2 to SN operate in the same way as rectifier R1 and switching circuit S1.

The operation of controller 3 shown in FIGS. 2 to 5 will now be described. As shown in FIG. 2, voltage detector 10 detects the instantaneous value of AC voltage VI supplied from commercial AC power source 4, and power failure detector 11 uses the detection result to determine whether or not AC voltage VI is being normally supplied from commercial AC power source 4.

When AC voltage VI is being normally supplied from commercial AC power source 4 (at the time of normal supply from commercial AC power source 4), power failure detector 11 outputs optical signals α1 to αN. When AC voltage VI is not being normally supplied from commercial AC power source 4 (at the time of a power failure of commercial AC power source 4), power failure detector 11 outputs optical signals β1 to βN.

As shown in FIG. 3, AC source voltage VA0 is generated by AC power source 15 to be provided to primary windings W1 of isolation transformers Tn and T(n+1). Isolation transformers Tn to T1 are sequentially connected, and output AC voltages VAn to VA1 from their respective secondary windings W2. Isolation transformers T(n+1) to TN are sequentially connected, and output AC voltages VA(n+1) to VAN from their respective secondary windings W2.

As shown in FIG. 2, AC output voltages VA1 to VAN from isolation transformers T1 to TN are provided to rectifiers R1 to RN, respectively. For example, AC voltage VA1 is applied between input terminals 30a and 30b of rectifier R1, as shown in FIG. 5.

During the periods of time when AC voltage VA1 is positive, a current flows from input terminal 30a through resistance element 32, diode 34, capacitor 38, diode 37, and resistance element 33 to input terminal 30b, thus charging capacitor 38.

During the periods of time when AC voltage VA1 is negative, a current flows from input terminal 30b through resistance element 33, diode 35, capacitor 38, diode 36, and resistance element 32 to input terminal 30a, thus charging capacitor 38. Capacitor 38 generates DC voltage VD1 across its terminals. DC voltage VD1 is provided to switching circuit S1.

Similarly, AC voltages VA2 to VAN are converted by rectifiers R2 to RN into DC voltages VD2 to VDN to be provided to switching circuits S2 to SN.

At the time of normal supply from commercial AC power source 4 (FIG. 1), power failure detector 11 (FIG. 2) outputs optical signals α1 to αN, with no output of optical signals β1 to βN. At this time, optical transistors 39 are ON, and optical transistors 40 are OFF in switching circuits S1 to SN. Thus, DC voltages VD1 to VDN are applied between the gates and the emitters of IGBTs Q1 to QN through optical transistors 39 of switching circuits S1 to SN, causing IGBTs Q1 to QN (i.e., switch 1) to be ON.

At the time of a power failure of commercial AC power source 4, power failure detector 11 (FIG. 2) outputs optical signals β1 to βN, with no output of optical signals α1 to αN. At this time, optical transistors 40 are ON, and optical transistors 39 are OFF in switching circuits S1 to SN. Optical transistors 40 in switching circuits S1 to SN connect the gates and the emitters of IGBTs Q1 to QN, causing IGBTs Q1 to QN (i.e., switch 1) to be OFF.

Figure 6:
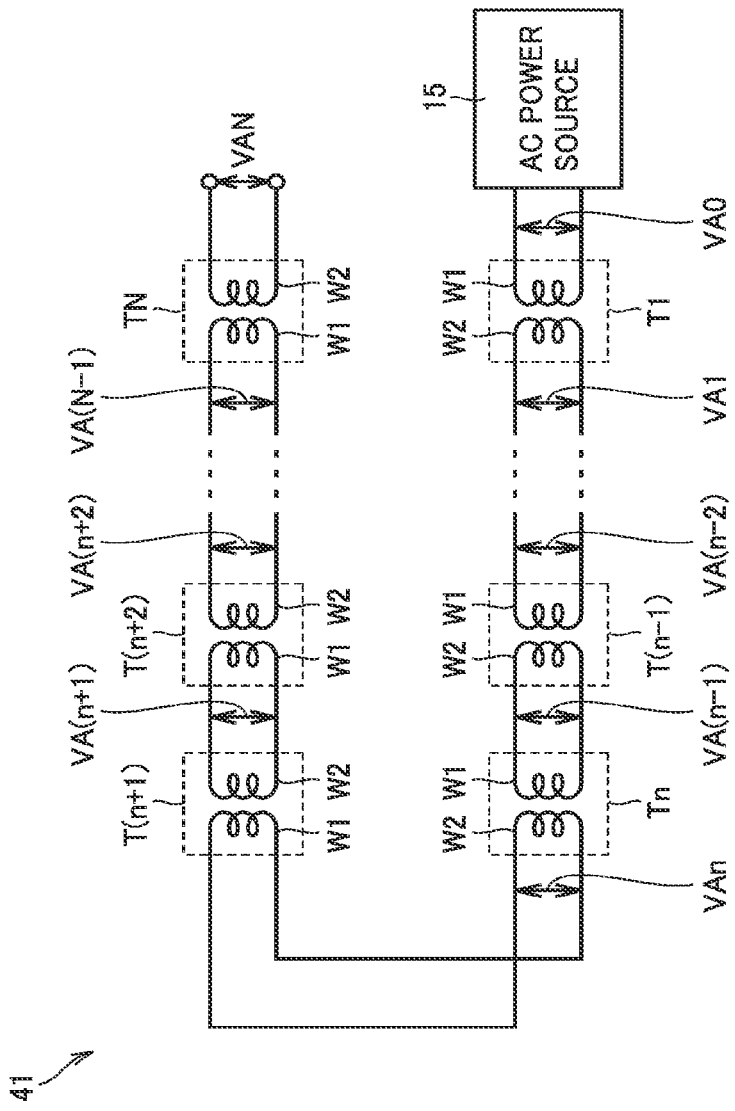
FIG. 6 is a circuit block diagram showing comparative example 1 of embodiment 1.

FIG. 6 is a circuit block diagram showing comparative example 1 of embodiment 1, by contrast with FIG. 3. With reference to FIG. 6, comparative example 1 is different from embodiment 1 in that AC voltage generator 12 is replaced with an AC voltage generator 41.

In this AC voltage generator 41, primary winding W1 of isolation transformer T1 receives AC output voltage VA0 from AC power source 15. Secondary windings W2 of isolation transformers T1 to T (N−1) are connected to primary windings W1 of isolation transformers T2 to TN, respectively. Isolation transformers T1 to TN respectively output AC voltages VA1 to VAN from their respective secondary windings W2.

Comparative example 1, in which isolation transformers T1 to TN are sequentially connected, results in a large sum of the load capacities of isolation transformers T1 to TN. For example, if N=7, with isolation transformer T7 having a load capacity of P, then the load capacities of isolation transformers T1 to T7 are 7P, 6P, 5P, 4P, 3P, 2P, P, respectively, with the sum of the load capacities being 28P. If isolation transformers each having a load capacity of 7P are used as isolation transformers T1 to T7 for better manufacturing efficiency, the load capacities add up to 49P.

By contrast, in AC voltage generator 12 in embodiment 1, if N=7 and n=3, then the load capacities of isolation transformers T1 to TN are P, 2P, 3P, 4P, 3P, 2P, P, respectively, with the sum of the load capacities being 16P, as described with reference to FIG. 3. Even if isolation transformers each having a load capacity of 4P are used as isolation transformers T1 to T7 for better manufacturing efficiency, the sum of the load capacities is 28P.

In general, isolation transformers having higher load capacities are larger and more costly than isolation transformers having lower load capacities. Embodiment 1 can reduce the sum of the load capacities of isolation transformers T1 to TN as compared to comparative example 1, thus allowing a reduced size and cost of the apparatus.

Figure 7:
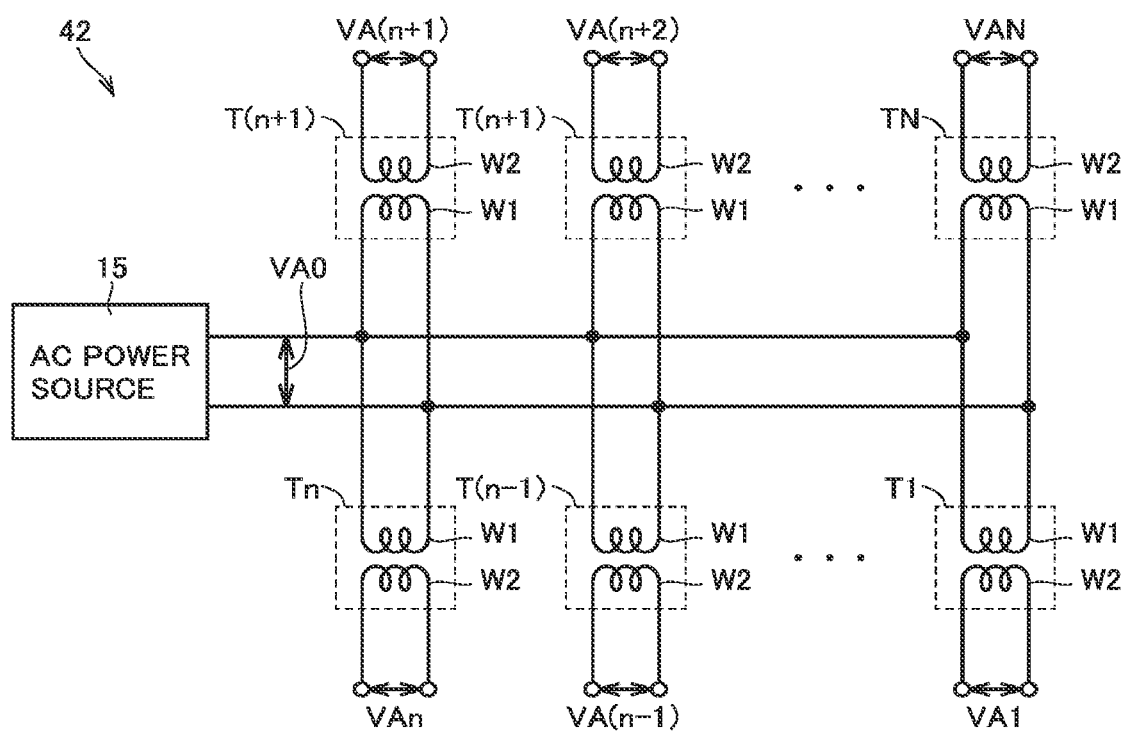
FIG. 7 is a circuit block diagram showing another comparative example 2 of embodiment 1.

FIG. 7 is a circuit block diagram showing another comparative example 2 of embodiment 1, by contrast with FIG. 3. With reference to FIG. 6, comparative example 2 is different from embodiment 1 in that AC voltage generator 12 is replaced with an AC voltage generator 42. In this AC voltage generator 42, primary windings W1 of isolation transformers T1 to TN receive AC output voltage VA0 from AC power source 15, and secondary windings W2 of isolation transformers T1 to TN output AC voltages VA1 to VAN, respectively.

Comparative example 2, in which isolation transformers T1 to TN are parallelly connected, results in a small sum of the load capacities of isolation transformers T1 to TN. For example, if N=7, with isolation transformer T7 having a load capacity of P, then the load capacities of isolation transformers T1 to T7 are all P, with the sum of the load capacities being 7P. Comparative example 2, however, requires high-voltage isolation transformers T1 to TN.

Specifically, let us assume that one terminal 1a of switch 1 has a voltage V1, and IGBTs Q1 to QN have emitter voltages V2 to V (N+1), respectively, as shown in FIG. 2. For example, if N=7, then IGBTs Q1 to Q7 have emitter voltages V2 to V8, respectively. If the voltage between terminals 1a and 1b of switch 1 is 7 kV, IGBTs Q1 to Q7 each have a collector-emitter voltage of 1 kV.

Emitter voltage V2 of IGBT Q1 is applied to secondary winding W2 of corresponding isolation transformer T1 through diodes 36 and 37 and resistance elements 32 and 33, as shown in FIG. 5. Emitter voltage V8 of IGBT Q7 is similarly applied to secondary winding W2 of isolation transformer T7.

Returning to FIG. 7, V8−V2=6 kV is applied between secondary windings W2 of isolation transformer T1 and isolation transformer TN (T7 in this example). Each of isolation transformers T1 and T7 individually needs to withstand 6 kV, because evenly dividing 6 kV between two isolation transformers T1 and T7 is difficult in terms of the isolation transformer structure. This example thus requires such high-voltage, expensive isolation transformers.

By contrast, in AC voltage generator 12 (FIG. 3) in embodiment 1, V2 and V3 are applied to secondary winding W2 and primary winding W1, respectively, of isolation transformer T1. This means that isolation transformer T1 is simply required to withstand 1 kV and thus can be a low-voltage, inexpensive isolation transformer. The same applies to the other isolation transformers T2 to T7.

In general, high-voltage isolation transformers are much larger and more costly than low-voltage isolation transformers. Embodiment 1 can use lower-voltage isolation transformers than comparative example 2, thus allowing a reduced size and cost of the apparatus.

Embodiment 2

Figure 8:
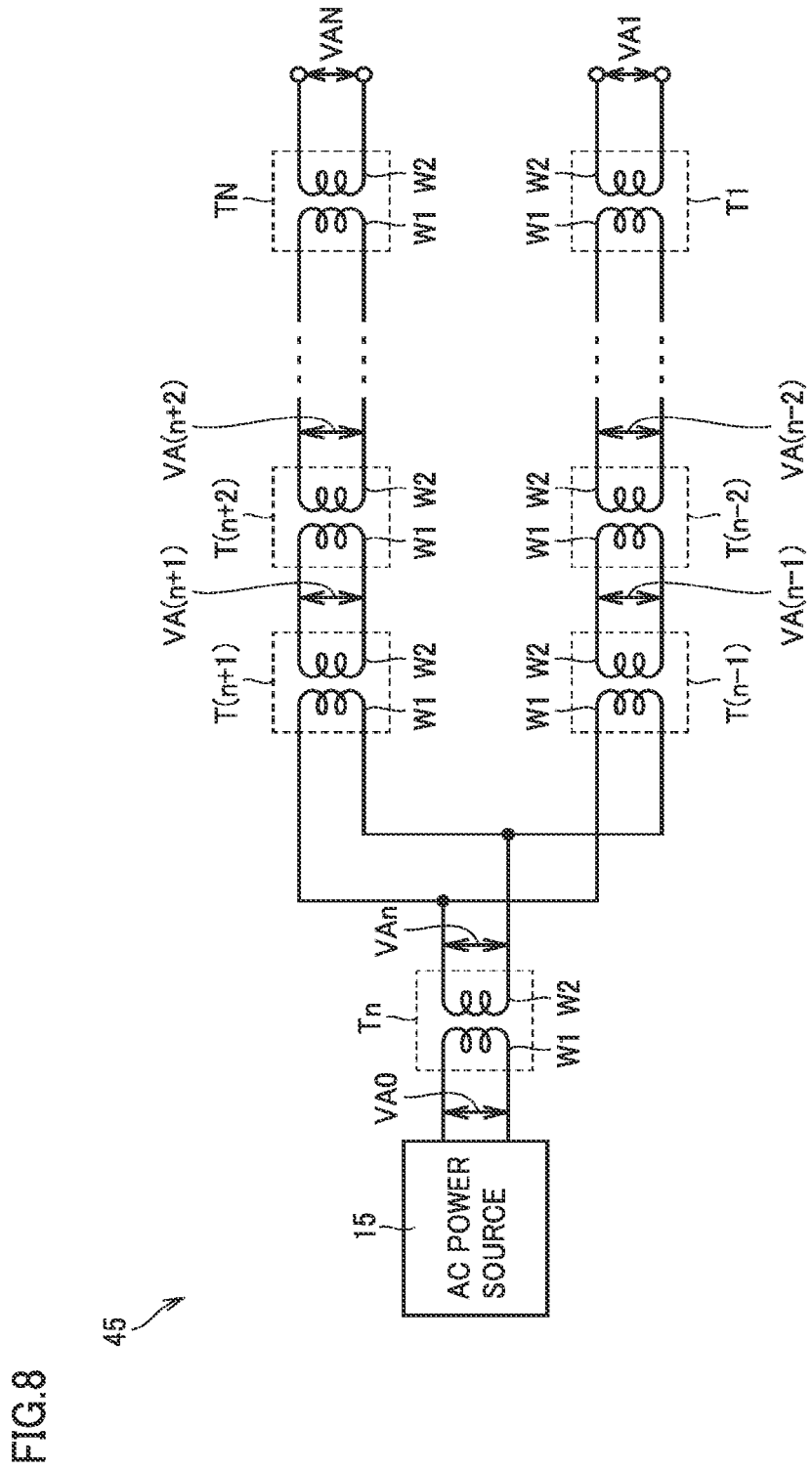
FIG. 8 is a circuit block diagram showing the major portion of an uninterruptible power supply according to embodiment 2 of the present invention.

FIG. 8 is a circuit block diagram showing the major portion of an uninterruptible power supply according to embodiment 2 of the present invention, by contrast with FIG. 3. With reference to FIG. 8, embodiment 2 is different from embodiment 1 in that AC voltage generator 12 is replaced with an AC voltage generator 45. Similar to AC voltage generator 12, AC voltage generator 45 includes AC power source 15 and isolation transformers T1 to TN.

Primary winding W1 of isolation transformer Tn receives AC source voltage V0. In this embodiment 2, N is a natural number of three or more, and n is a natural number smaller than N. For example, N=7 and n=4 are satisfied. Primary windings W1 of isolation transformers T1 to T(n−1) are connected to secondary windings W2 of isolation transformers T2 to Tn, respectively.

Primary windings W1 of isolation transformers T(n+1) to TN are connected to secondary windings W2 of isolation transformers Tn to T (N−1), respectively. Isolation transformers T1 to TN respectively output AC voltages VA1 to VAN from their respective secondary windings W2. The other configuration and operation are the same as those of embodiment 1, and the description thereof is not repeated.

In this AC voltage generator 45, isolation transformers Tn to T1 are sequentially connected, and isolation transformers Tn to TN are sequentially connected. For example, if N=7 and n=4, with isolation transformer T7 having a load capacity of P, then the load capacities of isolation transformers T1 to T7 are P, 2P, 3P, 7P, 3P, 2P, P, respectively, with the sum of the load capacities being 19P. Even if isolation transformers each having a load capacity of 3P are used as isolation transformers T1 to T3 and T5 to T7 for better manufacturing efficiency, the sum of the load capacities is 25P.

This embodiment can thus use isolation transformers having lower load capacities than those of comparative example 1. This embodiment also eliminates the need for high-voltage isolation transformers as are required in comparative example 2. This embodiment thus allows a reduced size and cost of the apparatus as compared to comparative examples 1 and 2.

Embodiment 3

Figure 9:
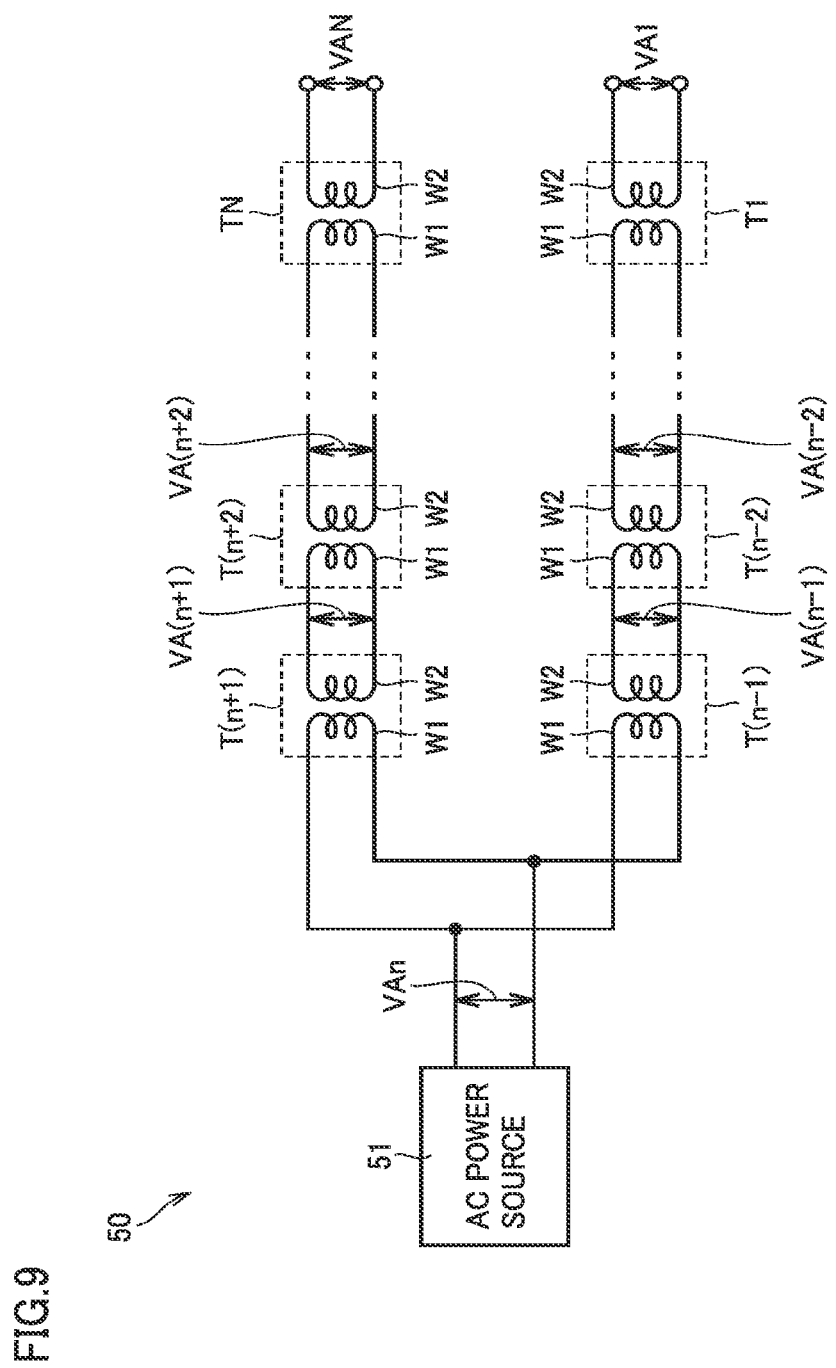
FIG. 9 is a circuit block diagram showing the major portion of an uninterruptible power supply according to embodiment 3 of the present invention.

FIG. 9 is a circuit block diagram showing the major portion of an uninterruptible power supply according to embodiment 3 of the present invention, by contrast with FIG. 8. With reference to FIG. 9, embodiment 3 is different from embodiment 2 in that AC voltage generator 45 is replaced with an AC voltage generator 50.

AC voltage generator 50 corresponds to AC voltage generator 45, but includes an AC power source 51 instead of AC power source 15 and isolation transformer Tn. AC power source 51 generates an AC voltage VAn having predetermined frequency M. Frequency f0 is set to a frequency that can be transmitted by a relatively small isolation transformer (e.g., 10 kHz).

Figure 10:
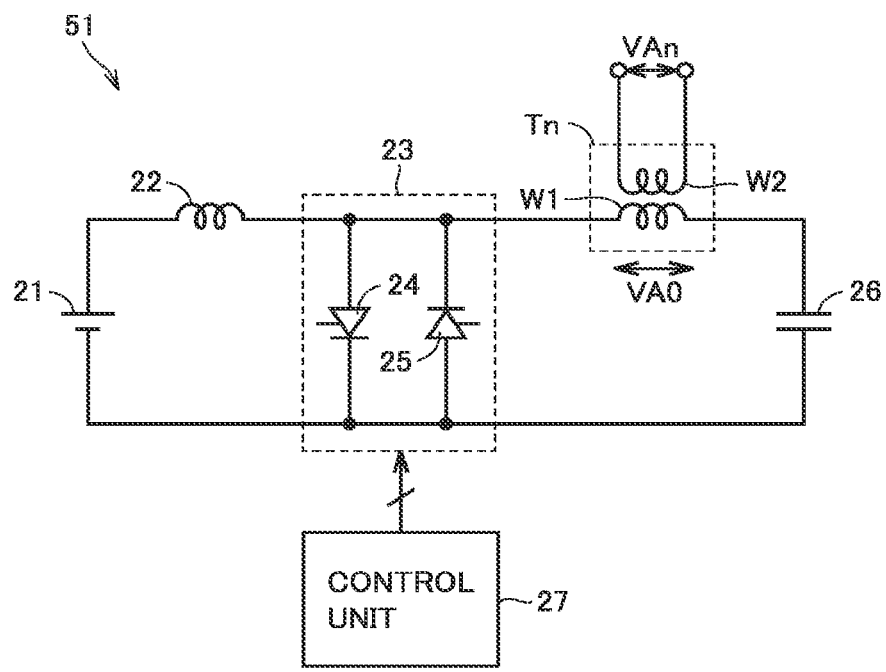
FIG. 10 is a circuit block diagram showing a configuration of the AC power source shown in FIG. 9.

FIG. 10 is a circuit block diagram showing a configuration of AC power source 51 shown in FIG. 9, by contrast with FIG. 4. With reference to FIG. 10, AC power source 51 corresponds to AC power source 15 but includes isolation transformer Tn instead of isolation transformer T0. Primary winding W1 of isolation transformer Tn has one terminal connected to the positive electrode of DC power source 21, with reactor 22 being connected therebetween; and the other terminal connected to the negative electrode of DC power source 21, with capacitor 26 being connected therebetween.

Primary winding W1 of isolation transformer Tn and capacitor 26 form an LC resonant circuit having a predetermined resonant frequency. Control unit 27 alternately turns on thyristors 24 and 25 at the resonant frequency. This causes AC source voltage VA0 to be generated at primary winding W1 of isolation transformer Tn. AC voltage VAn is then output from its secondary winding W2.

This embodiment 3, in which isolation transformer Tn is provided in AC power source 51, uses fewer isolation transformers than embodiment 2, thus allowing a reduced size and cost of the apparatus.

The embodiments disclosed herein should be considered illustrative in all respects, not limitative. The present invention is defined not by the above description but by the terms of the claims, and is intended to include any modification within the meaning and scope equivalent to the terms of the claims.

REFERENCE SIGNS LIST

TI: AC input terminal; TO: AC output terminal; TB: battery terminal; 1, 23: switch; CT: current detector; 2: bidirectional converter; 3: controller; 4: commercial AC power source; 5: load; 6: battery; Q1 to QN: IGBT; D1 to DN, 34 to 37: diode; 10: voltage detector; 11: power failure detector; FA1 to FAN, FB1 to FBN: optical fiber; 12, 41, 42, 45, 50: AC voltage generator; 13: DC voltage generator; 14: driver; R1 to RN: rectifier; S to SN: switching circuit; 15, 51: AC power source; T0 to TN: isolation transformer; W1: primary winding; W2: secondary winding; 21: DC power source; 22: reactor; 24, 25: thyristor; 26, 31, 38: capacitor; 27: control unit; 32, 33: resistance element; 39, 40: optical transistor

The invention claimed is:

1. A controller that controls a switch including first to Nth semiconductor switching elements connected in series, the controller comprising:
    an AC voltage generator that generates first to Nth AC voltages;
    a DC voltage generator that converts the first to Nth AC voltages into first to Nth DC voltages, respectively; and
    a driver that provides the first to Nth DC voltages to gates of the first to Nth semiconductor switching elements, respectively, to turn on the switch, and stops supplying the first to Nth DC voltages to the gates of the first to Nth semiconductor switching elements, respectively, to turn off the switch, wherein
    the AC voltage generator includes first to Nth isolation transformers,
    primary windings of the nth and (n+1)th isolation transformers receive an AC source voltage,
    primary windings of the first to (n−1)th isolation transformers are connected to secondary windings of the second to nth isolation transformers, respectively,
    primary windings of the (n+2)th to Nth isolation transformers are connected to secondary windings of the (n+1)th to (N−1)th isolation transformers, respectively,
    the first to Nth isolation transformers respectively output the first to Nth AC voltages from their respective secondary windings, and
    N is a natural number of two or more, and n is a natural number smaller than N.

2. The controller according to claim 1, wherein the first to Nth semiconductor switching elements are first to Nth insulated gate bipolar transistors, respectively.

3. The controller according to claim 2, wherein the switch further includes first to Nth diodes connected in antiparallel to the first to Nth insulated gate bipolar transistors, respectively.

4. The controller according to claim 1, further comprising a determination unit that determines whether or not a commercial AC power source is normal, wherein the switch is connected between the commercial AC power source and a load, and the driver operates based on a determination result from the determination unit, wherein the driver turns on the switch when the commercial AC power source is normal, and turns off the switch when the commercial AC power source is not normal.

5. A controller that controls a switch including first to Nth semiconductor switching elements connected in series, the controller comprising:

an AC voltage generator that generates first to Nth AC voltages;

a DC voltage generator that converts the first to Nth AC voltages into first to Nth DC voltages, respectively; and a driver that provides the first to Nth DC voltages to gates of the first to Nth semiconductor switching elements, respectively, to turn on the switch, and stops supplying the first to Nth DC voltages to the gates of the first to Nth semiconductor switching elements, respectively, to turn off the switch, wherein the AC voltage generator includes first to Nth isolation transformers, a primary winding of the nth isolation transformer receives an AC source voltage, primary windings of the first to (n−1)th isolation transformers are connected to secondary windings of the second to nth isolation transformers, respectively, primary windings of the (n+1)th to Nth isolation transformers are connected to secondary windings of the nth to (N−1)th isolation transformers, respectively, the first to Nth isolation transformers respectively output the first to Nth AC voltages from their respective secondary windings, and N is a natural number of three or more, and n is a natural number smaller than N.

6. The controller according to claim 5, wherein the AC voltage generator further includes an AC power source that generates the AC source voltage, and the nth isolation transformer is provided in the AC power source.

7. The controller according to claim 5, wherein the first to Nth semiconductor switching elements are first to Nth insulated gate bipolar transistors, respectively.

8. The controller according to claim 7, wherein the switch further includes first to Nth diodes connected in antiparallel to the first to Nth insulated gate bipolar transistors, respectively.

9. The controller according to claim 5, further comprising a determination unit that determines whether or not a commercial AC power source is normal, wherein the switch is connected between the commercial AC power source and a load, and the driver operates based on a determination result from the determination unit, wherein the driver turns on the switch when the commercial AC power source is normal, and turns off the switch when the commercial AC power source is not normal.

* * * * *